(12) United States Patent
Saito

(10) Patent No.: US 6,407,583 B2
(45) Date of Patent: Jun. 18, 2002

(54) LOGIC CIRCUIT HAVING PHASE-CONTROLLED DATA RECEIVING INTERFACE

(75) Inventor: Tatsuya Saito, Kunitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/810,664

(22) Filed: Mar. 19, 2001

(30) Foreign Application Priority Data

Jun. 26, 2000 (JP) ..................................... 2000-190727

(51) Int. Cl.[7] ...................... H03H 11/26; G06F 13/42; H04L 7/00
(52) U.S. Cl. ...................... 326/93; 326/86; 327/276; 713/400
(58) Field of Search ................. 326/93, 96, 86; 327/276, 237, 250; 713/400, 401

(56) References Cited

U.S. PATENT DOCUMENTS 5,539,349 A * 7/1996 Roy ........................ 327/276
5,589,788 A * 12/1996 Goto ....................... 327/276

FOREIGN PATENT DOCUMENTS

WO     96 29655     9/1996

* cited by examiner

*Primary Examiner*—Michael Tokar
*Assistant Examiner*—Daniel D. Chang
(74) *Attorney, Agent, or Firm*—Antonelli, Terry, Stout & Kraus, LLP

(57) ABSTRACT

A receiver circuit in a system for transferring data signals among integrated circuits or logic circuit blocks includes a receiving interface for allowing the data signal to be received at a correct timing. The receiving interface includes a detecting circuit for detecting whether or not a signal to be received has arrived at a detecting timing determined on the basis of a clock signal providing a timing base for signal receiving operation, a variable delay circuit inserted in a signal transfer path whose delay factor is controlled in dependence on the result of detection performed by the detecting circuit, and a flip-flop circuit for latching the signal outputted from the variable delay circuit in synchronism with the clock signal.

11 Claims, 13 Drawing Sheets

LOGIC CIRCUIT HAVING PHASE-CONTROLLED DATA RECEIVING INTERFACE

BACKGROUND OF THE INVENTION

The present invention relates in general terms a technique for transmitting or transferring data signals among a plurality of logic circuits. More particularly, the present invention is concerned with a technique for controlling or adjusting correctively a delay time (or time lag) involved in transmission of the data signal when variances thereof is noticeable, for thereby adjusting or regulating phase position of the data signal to a desired value upon reception thereof to realize a normal data transmission or transfer.

In the logic circuits or units such as those of a computer or the like, data signal transmissions or transfers (i.e., transmission/reception of the data signal) are performed among a plurality of logic circuits in synchronism with a clock signal. In that case, in order to ensure normal operations of these logic circuits, it is essentially required that the data signal as sent out from an addresser or sender logic circuit reach an addressee destination logic circuit, i.e., receiver logic circuit, within a prescribed time.

As the technique known heretofore in this conjunction, there may be mentioned a signal transfer method described, for example, WO96/29655. For having better understanding of the present invention, this prior art method will briefly be reviewed below.

FIG. 12 is a block diagram for illustrating the prior art method of transferring data signals among a plurality of logic circuits. In the figure, reference numeral 1201 denotes a logic circuit sending out a data signal (hereinafter also referred to simply as the sender logic circuit), and numeral 1202 denotes a logic circuit destined for receiving the data signal from the sender logic circuit 1201. Referring to the figure, a flip-flop circuit 1204 incorporated in the sender logic circuit 1201 is arranged to latch a data signal supplied from other circuit block 1203 in synchronism with a clock signal CK. The resultant output signal of the flip-flop circuit 1204 is sent out onto a wiring conductor 1206 through a driver circuit 1205. The receiver logic circuit 1202 receives the data signal through a receiver circuit 1207 incorporated in the receiver logic circuit 1202, which data signal is latched by a flip-flop circuit 1208 operating in synchronism with a clock signal CK2 to be conveyed to other circuit block equally incorporated in the receiver logic circuit 1202.

FIG. 13 is a timing chart for illustrating timing relations in the signal transmission described above. In this figure, reference symbols CK1 and CK2 designate the clock signals for the sender and receiver logic circuits mentioned above, D1 designates an output signal of the flip-flop circuit 1204 of the sender logic circuit 1201, D2 designates an input signal to the flip-flop circuit 1208 of the receiver logic circuit 1202, and D3 designates an output signal of the flip-flop circuit 1208.

Referring to FIG. 13, assuming that the system now under consideration is to be so designed that the signal D3 be outputted from the flip-flop circuit 1208 after the time lapse of two cycles in terms of the clock period as of the time point at which the signal D1 is outputted from the flip-flop circuit 1204, it is then required that the flip-flop circuit 1204, the driver circuit 1205, the wiring conductor 1206 and the receiver circuit 1207 have to be so designed as to involve the respective delay times so that the condition given by the undermentioned expression can be satisfied.

$$Tck < Td < 2 \times Tck \qquad \text{Exp. 1}$$

where Tck represents the clock period and Td represents a delay time or time lag intervening between the aforementioned signals D1 and D2 (inclusive of the delay time incurred by the flip-flop circuit 1204).

SUMMARY OF THE INVENTION

In the conventional logic circuit system described above, it is however noted that the signal delays brought about by the circuits such as the flip-flop circuit 1204, the driver circuit 1205, the receiver circuit 1207 and others as well as the delay incurred by the wiring conductor 1206 may vary due to variance of the respective manufacturing processes. In that case, the condition given by the above-mentioned expression Exp. 1 can no more be satisfied, giving rise to a problem that the data signal transmission as designed can not be realized, to a great disadvantage.

FIG. 14 is a timing chart for illustrating, by way of example, influence which makes appearance when the delay time Td varies or increases by ΔTd in the logic circuit system shown in FIG. 12. In this case, the undermentioned expression Exp. 2 will apply valid, as can be seen in FIG. 14.

$$(Td + \Delta Td) > 2 \times Tck \qquad \text{Exp. 2}$$

Apparently, the condition given by the expression Exp. 1 is not satisfied. That is to say, the signal D3 is not outputted from the flip-flop circuit 1208 after lapse of two cycles in terms of the clock period but outputted after three cycles of the clock period, which obviously differs from the requirement imposed in design.

In the light of the state of the art described above, it is an object of the present invention to solve the problem mentioned above by providing a logic circuit equipped with a phase-controlled data receiving interface for realizing the data transfer or transmission within a desired or designed time period through an automatic delay regulating control even in the case where the delay time involved in the data signal transmission should vary due to variances brought about in the manufacturing processes or for other causes.

Another object of the present invention is to provide an improved structure of logic circuit which makes it possible to carry out data reception under prescribed timing by absorbing variations of the delay time involved in the data signal transmission which exceeds the clock period.

In view of the above and other objects which will become apparent as the description proceeds, there is provided according to an aspect of the present invention a logic circuit which is comprised of a signal phase controller including a signal phase detection circuit for deciding or detecting the arrival of a signal to be received from external at a detecting time point predetermined as based on a clock signal which provides a basis for the signal receiving operation and a variable delay circuit whose delay factor or quantity is controlled in dependence on the result of the detection performed by the above-mentioned signal phase detection circuit, and a flip-flop circuit designed for latching the signal passed through the above-mentioned variable delay circuit in synchronism with the clock signal.

In a mode for carrying out the present invention, the signal phase detection circuit mentioned above may be so designed as to detect or decide the arrival of the signal to be received by detecting discriminatively whether the signal received is at level "H" (high level) or "L" (low level). However, with this arrangement, detection or decision as to arrival of the signal for reception can not be effectuated when the logical level "0" or alternatively "1" of the received signal continues successively. Thus, according to another mode for carrying out the present invention for coping with the situation mentioned above, a test signal is transmitted during a regulation period in place of the signal to be transferred intrinsically and a phase control is carried out completely in the receiver logic circuit during the regulation period in which the test signal is being transferred.

Thus, in a first embodiment of the present invention, the test signal mentioned above assumes a high level (level "H") during one period of the clock signal while assuming low level (level "L") during a succeeding period of the clock signal, wherein alteration of the levels "H" and "L" is repeated. By virtue of this arrangement, there can be realized the phase control which is capable of compensating for variation or change of the delay time so far as it falls within one period of the clock signal.

In another preferred embodiment of the present invention, a test signal which assumes the level "H" (high level) during a period corresponding to two periods of the clock signal while assuming succeedingly the level "L" (low level) during a succeeding period corresponding equally to two periods of the clock signal in a repetitive sequence is sent to the receiver logic circuit from the sender logic circuit with a view to compensating for variation of more noticeable time delays involved in the signal transmission.

In yet another preferred embodiment of the present invention, the signal phase controller provided in association with the receiver logic circuit is constituted by a plurality of phase control units interconnected to one another. A detection timing signal is applied simultaneously to these phase control units, each of which then responds thereto by performing simultaneously a phase control operation. To this end, each of the phase control units may include an adjustable or variable delay circuit and a signal phase detection circuit, wherein the signal phase detection circuit is so designed as to detect or decide the arrival of the test signal at a location on the output side of the variable delay circuit at a time point or timing commanded by the detection timing signal, to thereby output a delay control signal. On the other hand, each of the variable delay circuits is designed to impart selectively either one of two delay amounts or quantities to the signal passing therethrough, wherein selection of the delay quantity mentioned above is commanded by the delay control signal supplied from the signal detection circuit.

In a further preferred embodiment of the invention, the phase control circuit may equally be constituted by a plurality of phase control units interconnected to one another. Sequentially applied to the individual phase control units from the upstream side to the downstream side is a detection timing signal for forcing the phase control units to perform phase control operation in a sequential manner. Each of the phase control units includes a variable delay circuit and a signal phase detection circuit, wherein the signal phase detection circuit is designed to detect the passage of the test signal at a location on the output side of the variable delay circuit to thereby generate the delay control signal, as in the case of the mode described just above. The variable delay circuits connected in cascade have respective delay quantities which differ from one to another. More specifically, the delay quantities of the individual variable delay circuits are so set as to increment proportionally at an equal rate as viewed toward the upstream side. To say in another way, the phase control operations are carried out sequentially as a whole, wherein it is determined whether the delay quantity is to be imparted or not for the phase control while changing sequentially the delay quantity from rough to a fine value.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which.

DESCRIPTION OF THE EMBODIMENTS

The present invention will be described in detail in conjunction with what is presently considered as preferred or typical embodiments thereof by reference to the drawings.

Embodiment 1

Figure 1:
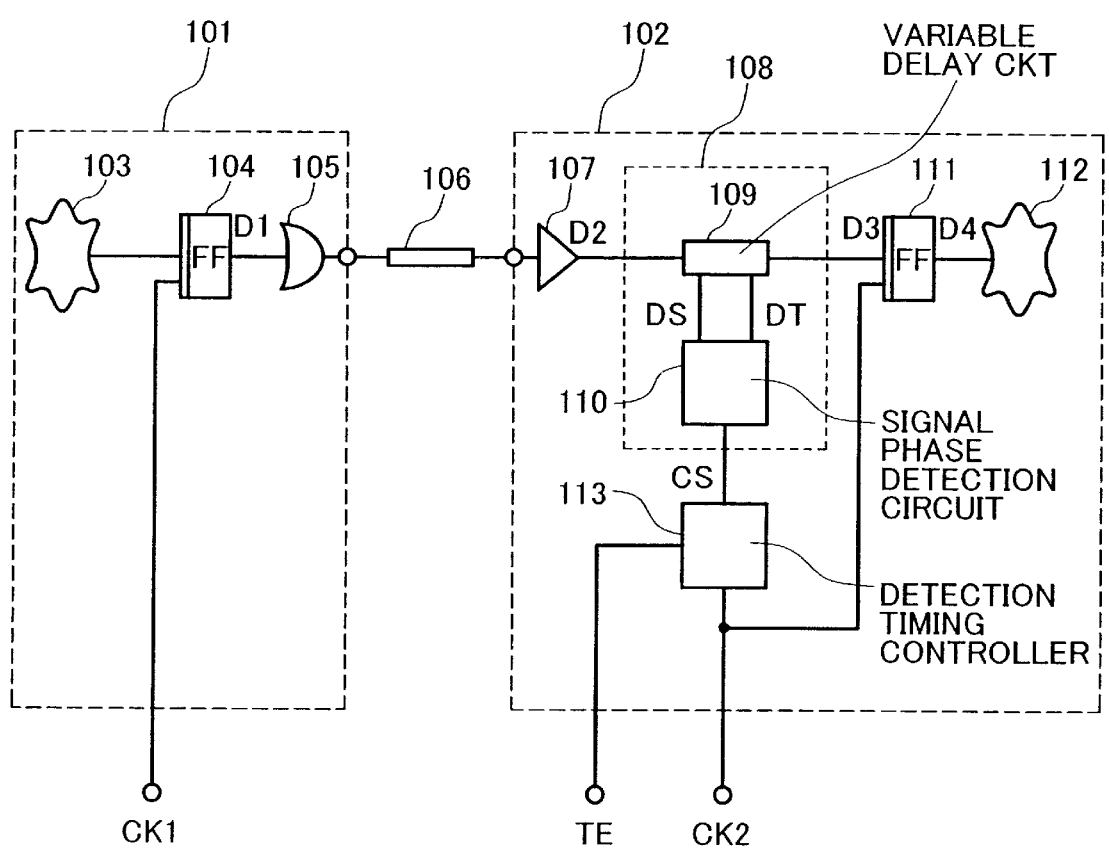
FIG. 1 is a schematic circuit diagram showing a basic structure of an interface circuit according to a first embodiment of the present invention.

FIG. 1 is a schematic circuit diagram showing a basic structure of an interface circuit according to a first embodiment of the present invention.

In the figure, reference numeral 101 denotes a logic circuit serving for sending a signal (hereinafter this logic circuit will also be referred to as the sender logic circuit only for the convenience of description), numeral 102 denotes a logic circuit provided on the signal receiving side (hereinafter this logic circuit will also be referred to as the receiver logic circuit only for the convenience of description). Each of these logic circuits 101 and 102 are implemented in the form of an integrated circuit. In the sender logic circuit 101 of the integrated circuit according to the instant embodiment of the invention, a flip-flop circuit 104 latches a data signal supplied from other circuit block 103 constituting a part of the sender logic circuit 101 for thereby sending out the data signal in synchronism with a clock signal CK1. Reference numeral 106 denotes a wiring conductor for transmitting or transferring the data signal from the sender logic circuit 101 to the receiver logic circuit 102. The wiring conductor 106 is integrally formed on a circuit board on which the logic circuits 101 and 102 are mounted. Reference numeral 105 denotes a driver circuit for driving the wiring conductor 106, and numeral 107 denotes a receiver circuit for transferring the received data signal to the internals of the integrated circuit. Reference numeral 108 denotes a signal phase controller which is designed to adjust or control the delay time of the data signal outputted from the receiver circuit 107. The output signal of the signal phase controller 108 is supplied to a flip-flop circuit 111 which in turn is so designed as to latch the data signal outputted from the signal phase controller 108 under the timing of a clock signal CK2 for thereby transferring the data signal to other circuit block 112 constituting a part of the receiver logic circuit 102.

The signal phase controller 108 which features an aspect of the present invention is comprised of a variable delay circuit 109 and a signal phase detection circuit 110. The signal phase detection circuit 110 detects the phase DS of the signal traveling through the variable delay circuit 109 at a time point designated by a detection timing signal CS to thereby hold the result of the detection. In dependence on this detection result being held, a delay control signal DT is outputted for controlling the delay factor or quantity of the variable delay circuit 109. A detection timing controller 113 responds to a control signal TE supplied externally of the integrated circuit by deriving the detection timing signal CS mentioned above from the clock signal CK2.

Now, description will be directed to the phase control operation of the interface circuit according to the instant embodiment of the invention.

Figure 2A:
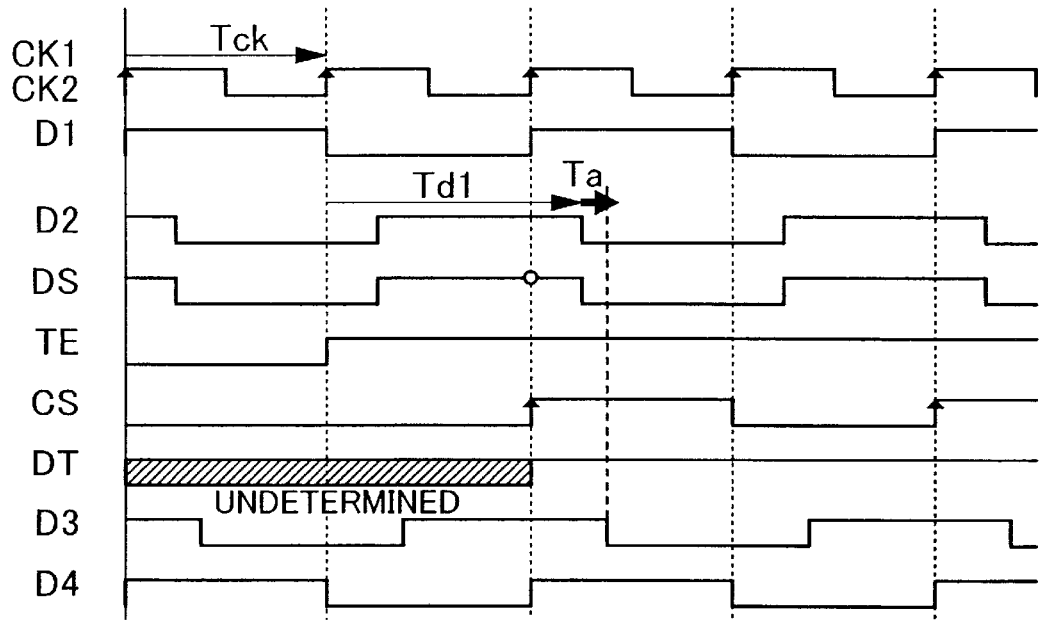
FIG. 2A is a timing chart for illustrating timing relations among various signals in the interface circuit shown in FIG. 1.
Figure 2B:
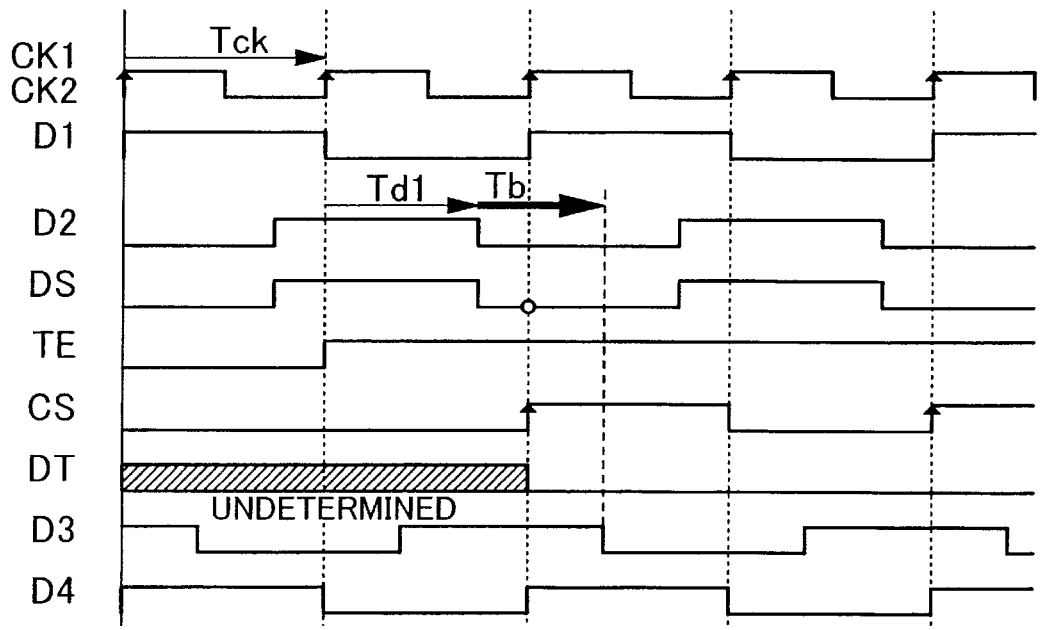
FIG. 2B is a timing chart similar to FIG. 2A except for difference in the delay time.

FIG. 2A is a timing chart for illustrating timing relations among various signals in the case where delay time involved in the signal transmission from the flip-flop circuit 104 of the sender logic circuit to the signal phase controller 108 of the receiver logic circuit by way of the driver circuit 105, the wiring conductor 106 and the receiver circuit 107 is given by Td1, while FIG. 2B is a timing chart similar to FIG. 2A except that the delay time mentioned above is given by Td2. In these figures, reference symbols CK1 and CK2 represent clock signals, respectively, each having a period Tck. A signal D1 represents the output signal of the flip-flop circuit 104 incorporated in the sender logic circuit 101 described above, while a signal D2 represents the input signal to the signal phase controller 108 of the receiver logic circuit 102.

A signal DS represents a detecting signal for conveying the signal traveling through the variable delay circuit 109 to the signal phase detection circuit 110 both incorporated in the signal phase controller 108 described above. Further, a signal TE represents a control signal supplied to the detection timing controller 113 mentioned previously. More specifically, in response to level "H" of this control signal TE, the detection timing controller 113 is put into operation, whereby the detection timing signal CS is generated. The detection timing signal CS is supplied to the signal phase detection circuit 110, which responds thereto by detecting the value or level of the aforementioned detecting signal DS at a leading edge timing of the detection timing signal CS, the detected value or level being latched to be held by the signal phase detection circuit 110. This value corresponds to that indicated by a circular mark in the figure. In dependence on the result of the detection, the delay control signal DT is outputted for controlling the delay quantities Ta and Tb of the variable delay circuit 109.

A signal D3 is outputted from the signal phase controller 108 as a result of the phase control performed by the variable delay circuit 109. This output signal D3 is latched by the flip-flop circuit 111 under the timing of the clock signal CK2. The output signal of the flip-flop circuit 111 is designated by D4.

In the case where the delay time Td1 intervenes between the signal D1 and the signal D2 and where the detecting signal assumes level "H" at the leading edge timing of the detection timing signal CS, the signal phase detection circuit 110 outputs the delay control signal DT of level "H", as shown in FIG. 2A. As a result of this, the delay quantity of the variable delay circuit 109 is set to Ta, as a result of which the output signal D3 is generated by the signal phase controller 108, as can be seen in FIG. 2A. Consequently, the flip-flop circuit 111 latches the signal D3 under the timing of the clock signal CK2 to thereby output a signal D4.

On the other hand, in the case where the delay time Td2 intervenes between the signal D1 and the signal D2 and where the detecting signal DS assumes level "L" at the leading edge timing of the detection timing signal CS, the signal phase detection circuit 110 outputs the delay control signal DT of level "L", as illustrated in FIG. 2B. In this case, the delay time is so regulated or controlled that the phase of the output signal D3 of the signal phase controller 108 undergoes greater delay when compared with the case shown in FIG. 2A because the delay quantity (or delay factor) of the variable delay circuit 109 is set to Tb. As a result of this, the signal D4 is outputted from the flip-flop circuit 111 as a result of reception of the signal D3 under the timing of the clock signal CK2, similarly to the case illustrated in FIG. 2A.

In both the cases shown in FIGS. 2A and 2B, the detection timing signal CS is interrupted by setting the control signal TE to the level "L" once the quantity Ta or Tb to be adjusted by the signal phase controller 108 has been determined, whereupon adjustment of the delay time is performed. Thus, the normal transmission/reception of the ordinary data signal can be carried out.

By virtue of the arrangement of the interface circuit described above, variation in the delay time involved in the signal transmission from the sender logic circuit 101 to the receiver logic circuit 102 which may be attributed to variance of the manufacturing process and others can be detected to thereby allow the delay quantity to be adjusted, whereby the normal signal transfer can be realized. Owing to this feature, even in the case where the signal transmission is impossible with the conventional system because of remarkable variance, high speed signal transmission can easily be realized.

At this juncture, it should be mentioned that although the foregoing description has been made on the presumption that the signal transmission is performed between the two integrated circuits. However, this is only by way of example. The teachings of the present invention can equally be applied to the signal transmission among three or more logical apparatuses such as computers as well as signal transmissions among three or more logic circuits incorporated in an integrated circuit (IC). Same holds true in the description which follows.

In the system described above by reference to FIG. 1, such signal pattern that the level "H" continues for a time period equal to the period Tck of the clock signal, being followed by level "L" continuing for a time equal to the period Tck, which pattern is repeated, as shown in FIG. 2, is employed as the signal pattern sent from the sender logic circuit 101 to the receiver logic circuit.

In this conjunction, it is to be noted that such simple signal pattern encounters can be generated easily. To this end, the flip-flop circuit 104, for example, may be so implemented as to operate as a toggle flip-flop where the output signal is inverted every time the clock signal is inputted.

However, it has also to be mentioned that magnitude of variation of the delay time of the signal which can be adjusted must not exceed the value Tck when the pattern which is repeated with the period of 2×Tck is employed for the adjustment of the delay time.

In the case where magnitude of the variation of the delay time of the data signal exceeds Tck, a signal pattern having an extended period is required for the adjustment. In that case, a test signal generator may be incorporated in the sender logic circuit.

Embodiment 2

Figure 3:
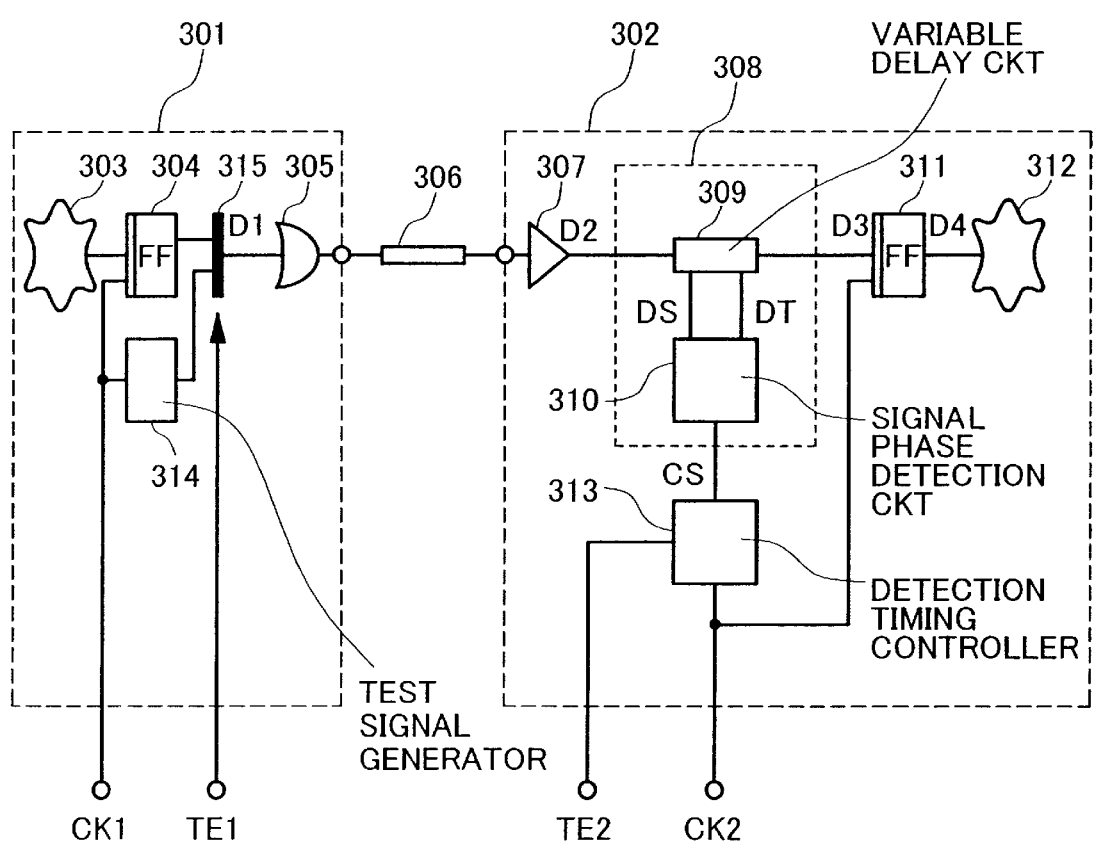
FIG. 3 is a block diagram showing a structure of an interface circuit according to another embodiment of the present invention.

FIG. 3 is a block diagram showing a structure of an interface circuit in which a test signal generator is provided according to a second embodiment of the present invention.

In FIG. 3, reference numeral 301 denotes a sender logic circuit (i.e., logic circuit for sending a signal) while numeral 302 denotes a receiver logic circuit (i.e., logic circuit destined for receiving the signal). In the sender logic circuit 301, there is incorporated a test signal generator 314 for generating a test signal for the purpose of adjusting or controlling the delay time. A flip-flop circuit 304 is designed to latch the ordinary data signal from other circuit block 303 provided internally of the sender logic circuit 301 for outputting the data signal in synchronism with a clock signal CK1. A selector 315 operating in response to a control signal TE1 ordinarily selects the output of the flip-flop circuit 304 while selecting the output signal of the test signal generator 314 for adjusting the delay time. The selected signal is transmitted through a driver circuit 305.

By contrast, the receiver logic circuit 302 is implemented essentially in a same structure as that of the interface circuit described hereinbefore in conjunction with the first embodiment of the invention. Accordingly, the signal transmitted through the wiring conductor 306 (i.e., the data signal or the test signal) is received by a receiver circuit 307 to be transmitted to a flip-flop circuit 311 by way of a variable delay circuit 309 incorporated in a signal phase controller 308. The flip-flop circuit 311 is arranged to latch the signal outputted from the signal phase controller 308 at the timing of the clock signal CK2 to thereby transfer that signal to other circuit block 312 incorporated in the receiver logic circuit 302. The delay factor or quantity of the variable delay circuit 309 is controlled by the delay control signal DT outputted from a signal phase detection circuit 310, whereby the phase of data reception is regulated. For determining the delay factor or quantity mentioned above, the phase of the signal travelling through the variable delay circuit is detected by the signal phase detection circuit 310, whereon the timing for the phase detection is determined by a detection timing controller 313.

By adopting the circuit structure shown in FIG. 3, the period of the test signal used for the signal delay time control can be extended, as a result of which even for the delay time which exceeds the period Tck of the clock signal, the desired adjustment can be performed.

Figure 4A:
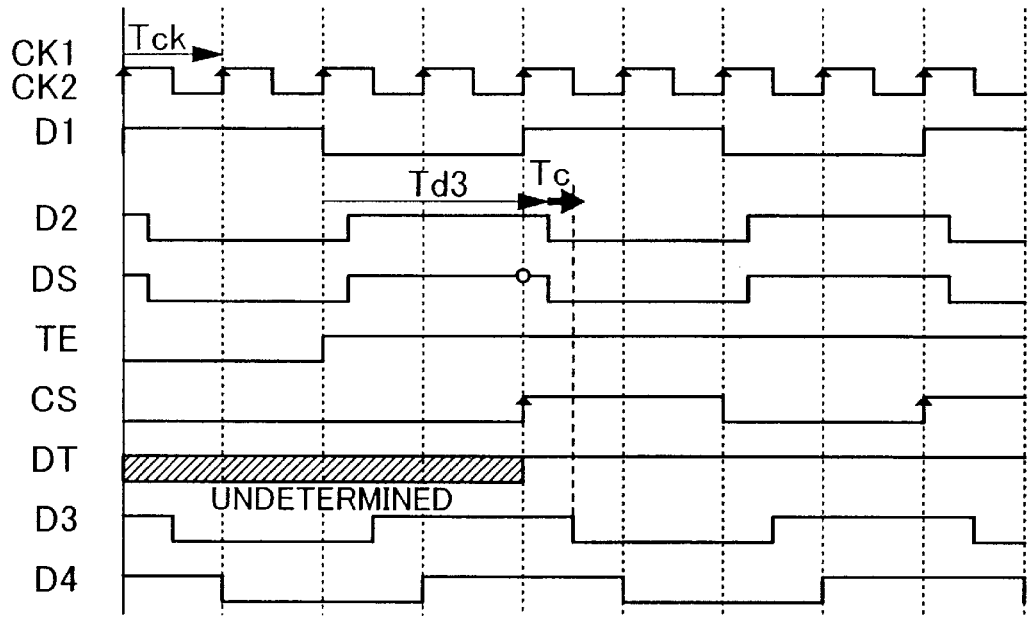
FIG. 4A is a timing chart for illustrating timing relations among various signals in the interface circuit shown in FIG. 3.
Figure 4B:
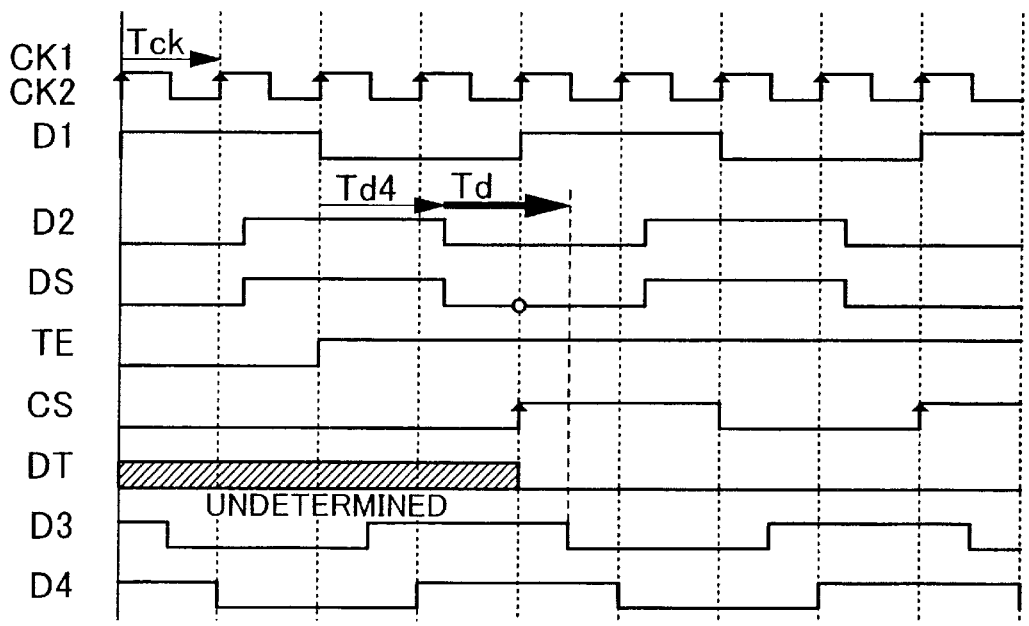
FIG. 4B is a timing chart similar to FIG. 4A except for difference in the delay time.

FIGS. 4A and 4B are views for illustrating operations of the interface circuit shown in FIG. 3. More specifically, FIG. 4A illustrates the operation in the case where the delay time involved in the signal transmission from the flip-flop circuit 304 of the sender logic circuit to the signal phase controller 308 of the receiver logic circuit is Td3, while FIG. 4B illustrates the operation in the case where the delay time is Td4. In this conjunction, it is presumed that difference between Td3 and Td4 is greater than the period Tck. In FIGS. 4A and 4B, CK1 and CK2 represent clock signals, respectively, each having the period Tck. Accordingly, FIGS. 4A and 4B show the cases where variation of the delay time in the signal transmission exceeds the period of the clock period.

The signal D1 represents the output signal of the test signal generator 314 incorporated in the sender logic circuit described above, while the signal D2 represents the input signal to the signal phase controller 308 of the receiver logic circuit. The signal DS represents a detecting signal for conveying the signal traveling through the variable delay circuit 309 incorporated in the signal phase controller 308 to the signal phase detection circuit 310. Further, a signal TE2 represents the control signal supplied to the detection timing controller 313 mentioned previously. In response to this control signal of level "H", the detection timing controller 313 is put into operation, whereby a detection timing signal CS is generated.

The period of the detection timing signal CS is selected to be equal to or longer than that of the test signal supplied from the sender logic circuit in order to exclude erroneous detection. The detection timing signal CS is supplied to the signal phase detection circuit 310, which responds thereto by detecting the value or level of the aforementioned detecting signal DS at the leading edge timing of the detection timing signal CS, the detected value or level being held by the signal phase detection circuit 310. In dependence on the result of the detection, the delay control signal DT is outputted for controlling the delay Tc; Td of the variable delay circuit 309. A signal D3 is outputted from the signal phase controller 308 as a result of the phase control performed by the variable delay circuit 309. This output signal D3 is received by the flip-flop circuit 311 under the timing of the clock signal CK2. The output signal of this flip-flop circuit 311 is designated by D4.

In the case where the delay time Td3 intervenes between the signal D1 and the signal D2 and where the detecting signal assumes level "H" at the leading edge timing of the detection timing signal CS, the signal phase detection circuit 310 outputs the delay control signal DT of level "H", as is shown in FIG. 4A.

As a result of this, the delay quantity of the variable delay circuit 309 is set to the value Tc, which results in generation of the output signal D3 by the signal phase controller 308 as illustrated in FIG. 4A. Consequently, the flip-flop circuit 311 latches the signal D3 under the timing of the clock signal CK2 to thereby output a signal D4.

On the other hand, in the case where the delay time of Td4 intervenes between the signals D1 and D2 and where the detecting signal DS assumes level "L" at the leading edge timing of the detection timing signal CS, the signal phase detection circuit 310 outputs the delay control signal DT of level "L", as shown in FIG. 4B.

In this case, the delay time is so regulated or controlled that the phase of the output signal D3 of the signal phase controller 308 undergoes longer delay when compared with the case shown in FIG. 4A because the delay quantity of the variable delay circuit 309 is set to Td. As a result of this, the signal D4 is outputted from the flip-flop circuit 311 which latches the signal D3 under the timing of the clock signal CK2, similarly to the case shown in FIG. 4A.

Similarly to the case described hereinbefore by reference to FIGS. 1 and 2, the value of the delay control signal DT is fixed once the quantity Tc; Td to be adjusted has been determined. In the logic circuit of the sender logic circuit, the test signal is then replaced by the ordinary data signal. In this manner, the delay time is adjusted, and upon completion thereof, it is possible to carry out the normal transmission/reception of the data signal.

Embodiment 3

In the case of the interface circuits shown in FIGS. 1 and 3, the signal phase controller comprised of the variable delay circuit and the signal phase detection circuit is implemented in a single stage. In this conjunction, it is however noted that by implementing the signal phase controller in a multistage configuration, the range for adjusting the delay time can be increased, and the delay time can be adjusted more finely.

Figure 5:
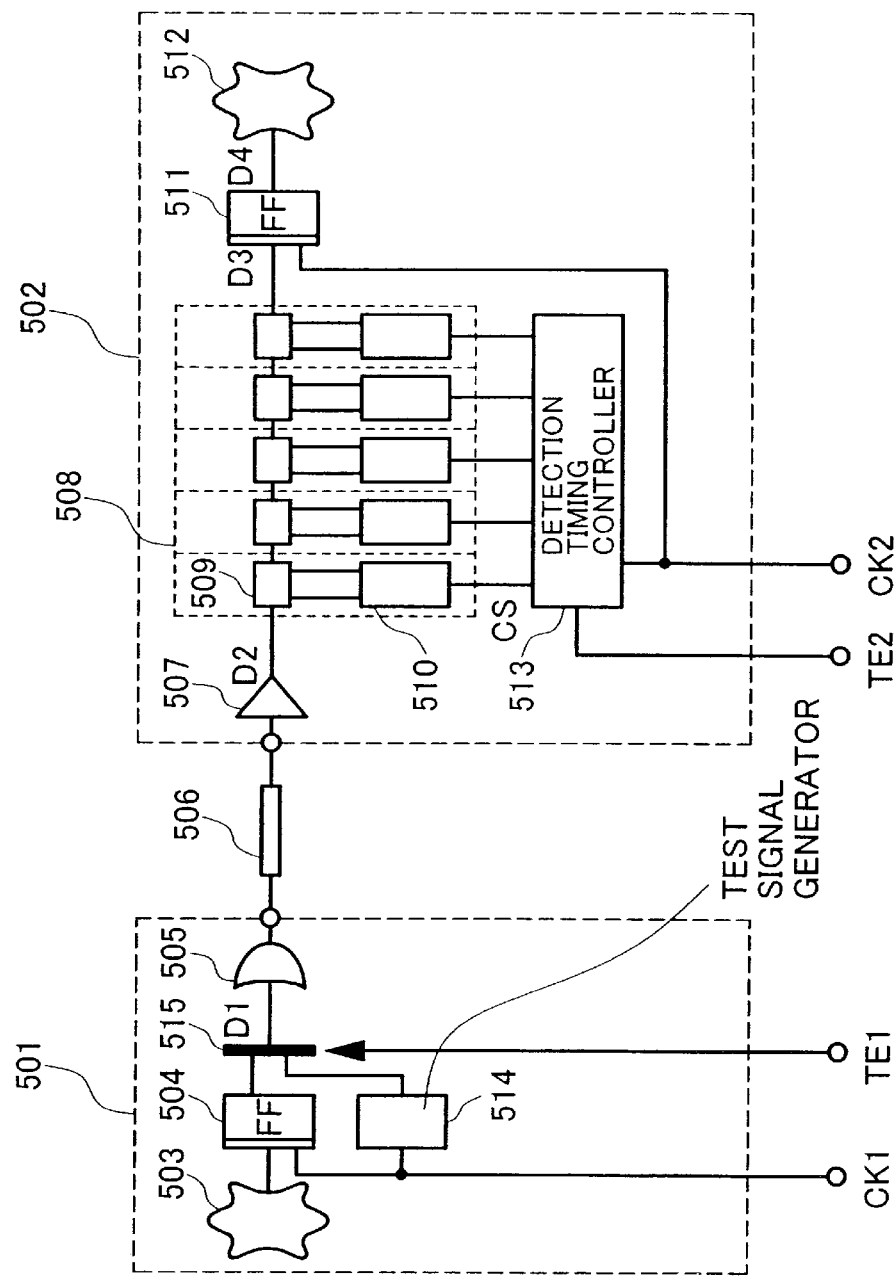
FIG. 5 is a block diagram showing a structure of the interface circuit according to yet another embodiment of the present invention.

FIG. 5 is a circuit diagram showing the integrated circuit in which a multi-stage signal phase modulator is adopted according to teachings of the invention incarnated in a third embodiment thereof. In the interface circuit now under consideration, the structure of the sender logic circuit 501 is utterly same as that of the sender logic circuit 301 described hereinbefore by reference to FIG. 3. Thus, in the ordinary operation mode, the data signal outputted from the flip-flop circuit 504 is selected by a selector 515 to be sent out through the driver circuit 505. On the other hand, in the delay time regulation mode, the test signal generated by a test signal generator 514 is selected by the selector 515 to be transmitted to the receiver logic circuit.

The signal transmitted to a receiver logic circuit 502 through the medium of a wiring conductor 506 is inputted to a signal phase controller 508 via a receiver circuit 502. The signal phase controller 508 is implemented in five stages interconnected to one another. A flip-flop circuit 511 latches the signal outputted from the signal phase controller 508 under the timing of the clock signal CK2, which signal is then supplied to other circuit block 512 incorporated in the receiver logic circuit 502.

Each stage of the signal phase controller 508 is constituted by a variable delay circuit 509 and a signal phase detection circuit 510. Further, in FIG. 5, reference numeral 513 denotes a detection timing controller designed for deriving a detection timing signal CS from the clock signal CK2 under the control of a control signal TE2 supplied externally of the integrated circuit, wherein the detection timing signal CS is supplied to the signal phase detection circuits 510 of the individual stages of the signal phase controller 508, respectively.

Figure 6:
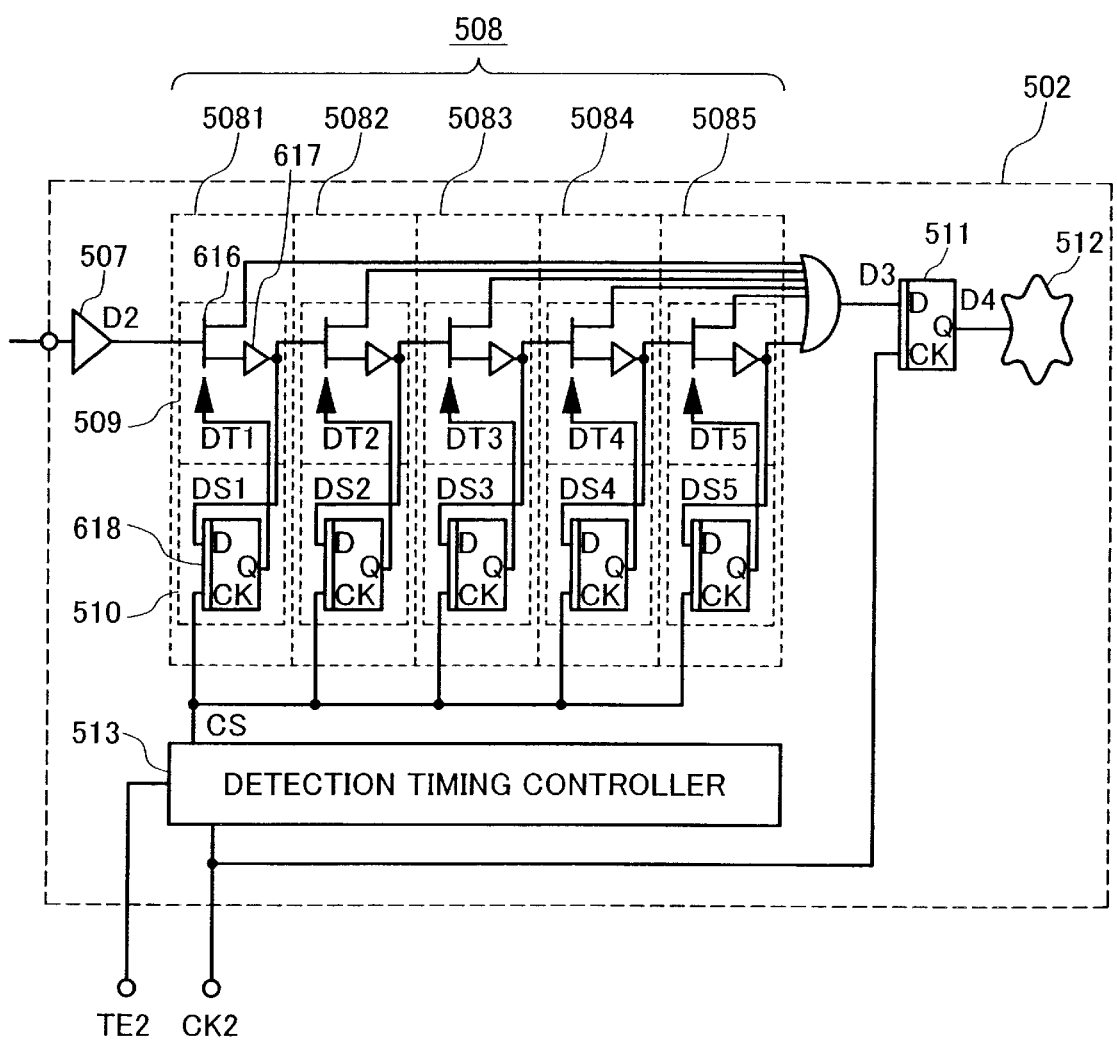
FIG. 6 is a block diagram showing an exemplary structure of a receiver logic circuit of the interface circuit shown in FIG. 5.

FIG. 6 shows an exemplary structure of the receiver logic circuit shown in FIG. 5, in which same reference symbols as those used in FIG. 5 denote like circuit blocks.

The signal phase controller 508 is constituted by five phase control units 5081, 5082, 5083, 5084 and 5085 interconnected in cascade. More specifically, each of these phase control units is comprised of the variable delay circuit 509 which is constituted by a selector 616 and a delay element 617 and the signal phase detection circuit 510, wherein the signal outputted from the delay element 617 is supplied to the selector of the phase control unit in each stage. More specifically, in each of the individual stages, the selector is connected to either one of the delay element or the tap output terminal. The tap output terminals of the individual stages and the output terminal of the delay element in the final stage, i.e., the six output terminals in total are logically ORed to be supplied to the data input terminal of the flip-flop circuit 511.

Further, in each of the stages, the selector serves for selecting the destination of the delay control signal DT1, DT2, DT3, DT4, DT5 supplied from the signal phase detection circuit. In this manner, the number of the delay elements inserted in the signal transfer path can be determined. To say in another way, in each of the variable delay circuits, one of the selectable delay quantities is selected, whereby the overall delay quantity can be determined.

The signal phase detection circuit 510 is constituted by a flip-flop circuit 618. Connected to the data input terminal of the flip-flop circuit 618 is the output terminal of the delay element of each stage, while applied to the clock input terminal of the flip-flop circuit is the detection timing signal CS outputted from the detection timing controller 513. By virtue of this arrangement, the timing levels indicated by the detection timing signals CS of the detecting signals DS1, DS2, DS3, DS4, DS5 which have passed sequentially through the individual delay elements are latched by the flip-flop circuits in the individual stages, respectively, as a result of which the variable delay circuits 509 are controlled by the delay control signals DT1, DT2, DT3, DT4, DT5 outputted from the above-mentioned flip-flop circuits, respectively.

As described hereinbefore, the period of the detection timing signal CS is so set as to be equal to or longer than that of the test signal sent from the sender logic circuit. Parenthetically, generation and interruption of the detection timing signal CS is controlled by the control signal TE2 supplied externally of the integrated circuit under consideration.

Figure 7:
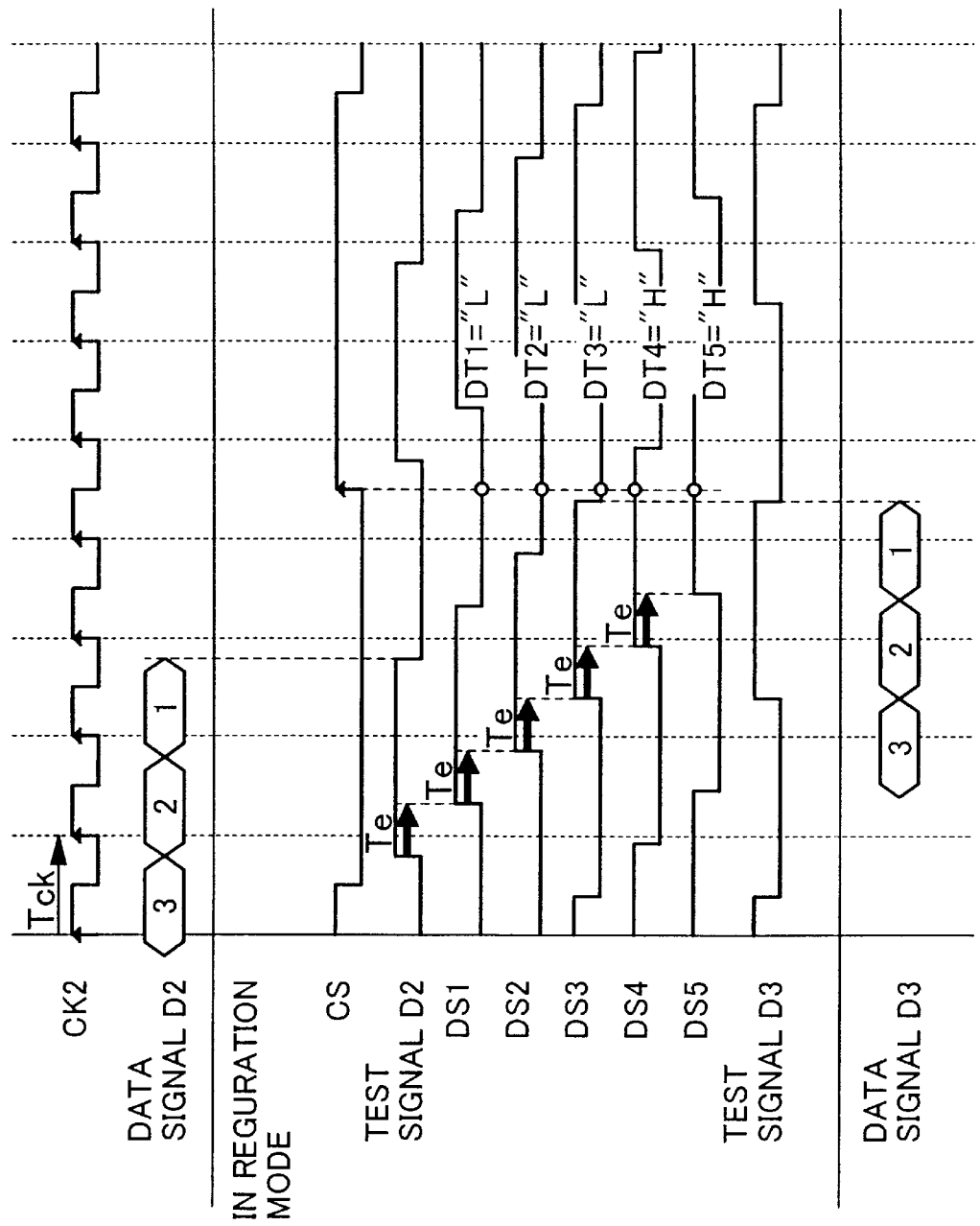
FIG. 7 is a timing chart for illustrating timing relations among various signals in the receiver logic circuit shown in FIG. 6.
Figure 8:
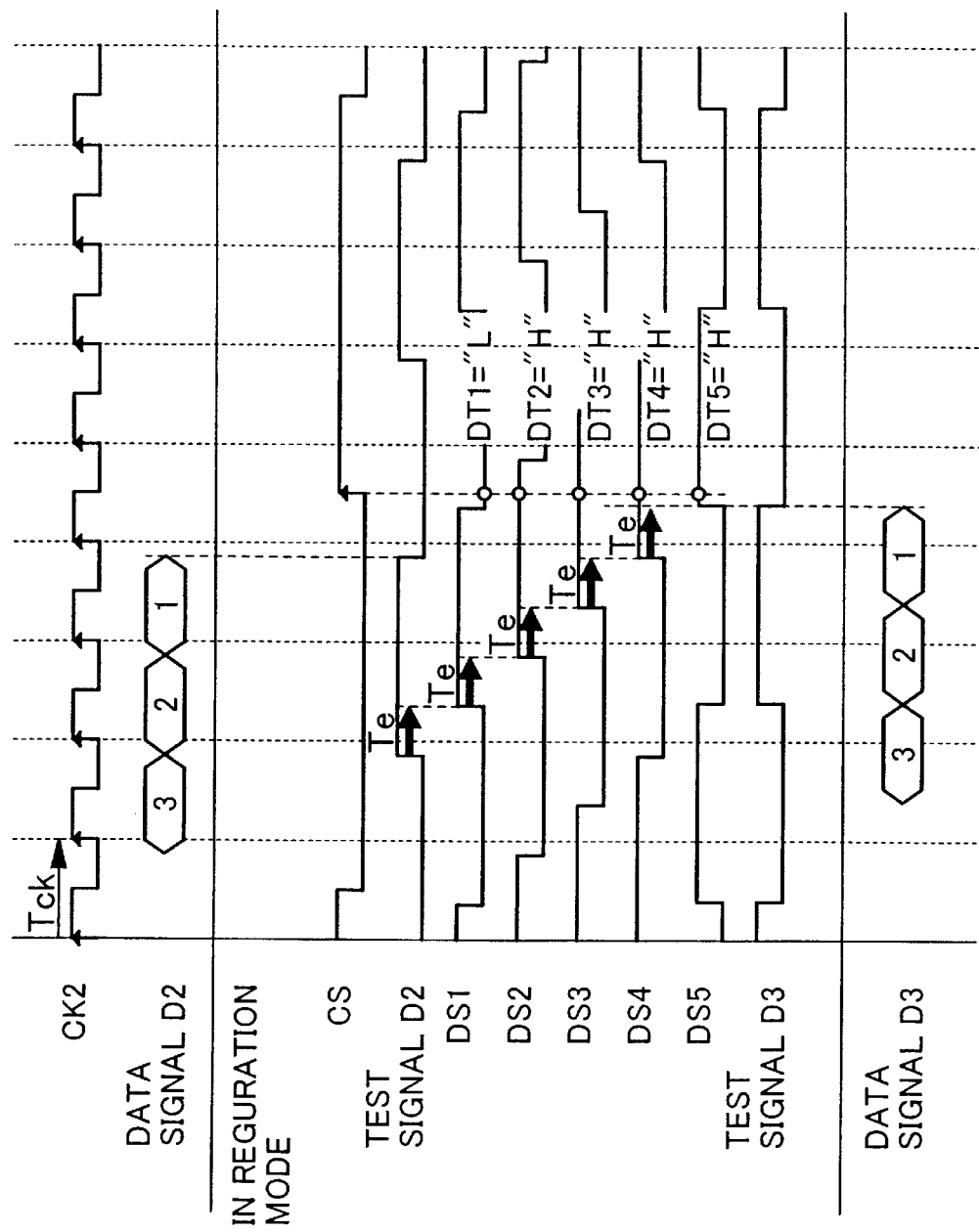
FIG. 8 is another timing chart for illustrating timing relations among various signals in the receiver logic circuit shown in FIG. 6.

Next, referring to FIGS. 7 and 8, description will be directed to operations involved in adjustment of variation of the delay time of the data signal in the interface circuit according to the embodiment shown in FIG. 6.

Both of FIGS. 7 and 8 show the operation of the receiver logic circuit 502 for regulating the delay time of the test signal D2 inputted thereto. The operation illustrated in FIG. 8 differs from that shown in FIG. 7 in that the test signal D2 arrives at a retarded timing.

In both of these figures, reference character CK2 designates the clock signal whose period is represented by Tck.

The data signal D2 and the data signal D3 are illustrated at the timing for the ordinary data signal transmission, while the other signals are shown at the respective timings in the phase control operation mode.

The test signal D2 is sent out from the sender logic circuit in the course of the phase control operation to be applied to the input terminal of the signal phase controller 508. The phase of the test signal D2 coincides with that of the data signal D2. On the other hand, the period of the detection timing signal CS supplied to the signal phase detection circuit 510 is set to a value equal to a multiple of the period of the test signal D2 by a natural number with a view to avoiding erroneous detection. In the case of the instant embodiment of the invention, the period of the detection timing signal CS is presumed to be twice as long as that of the test signal D2 only by way of example.

In the phase control operation mode, all the delay control signals DT1, DT2, DT3, DT4 and DT5 are set to level "L" and the test signal is caused to pass sequentially through the delay elements incorporated in the respective phase control units. As a result of this, the signals DS1, DS2, DS3, DS4 and DS5 have the respective phases each delayed by the delay time Te of the relevant delay element, as can be seen in the figure.

Since the flip-flop circuits 618 of the individual phase control units 5081, 5082, 5083, 5084 and 5085 hold the values or levels of the signals DS1, DS2, DS3, DS4 and DS5, respectively, at the leading edge timing of the detection timing signal CS, the values or levels at the time points each indicated by a circular mark in FIGS. 7 and 8 are held as the results of detection. Thus, in the case of the example illustrated in FIG. 7, the delay control signal DT1 is at the level "L", the delay control signal DT2 is at the level "L", the delay control signal DT3 is at the level "L", the delay control signal DT4 is at the level "H" and the delay control signal DT5 is at the level "H". On the other hand, in the case illustrated in FIG. 8, the delay control signal DT1 is at the level "L", the delay control signal DT2 is at the level "H", the delay control signal DT3 is at the level "H", the delay control signal DT4 is at the level "H" and the delay control signal DT5 is at the level "H".

Consequently, in the case illustrated in FIG. 7, the test signal D2 passes sequentially through the delay elements of the phase control units 5081, 5082 and 5083 in this order to be transferred to the flip-flop circuit 511 through the tap output terminals of these phase control units, respectively. In the case illustrated in FIG. 8, the test signal D2 passes through only one stage of the delay circuit of the phase control unit 5081 to be inputted to the flip-flop circuit 511 from the tap output terminal of the phase control unit 5082. As a result of this, the delay time of the test signal D3 is so regulated or controlled that the phase of the test signal D3 substantially coincides with that of the detection timing signal CS in both the cases illustrated in FIGS. 7 and 8.

After the phase control operation, the values or levels of the delay control signals DT1, DT2, DT3, DT4 and DT5 are fixed, and thus the delay time is so set that the phase of the data signal D3 substantially coincides with that of the detection timing signal CS.

As is apparent from the foregoing, according to the teachings of the invention incarnated in the instant embodiment, it is possible to cause the phase of the detection timing signal CS to coincide substantially with that of the data signal D3 through the phase control operation.

Thus, in order to ensure that the flip-flop circuit 511 can receive normally the signal, the detection timing controller 513 should be so controlled that the phase of the leading edge of the detection timing signal CS has a sufficient time margin relative to that of the leading edge of the clock signal CK.

Figure 9:
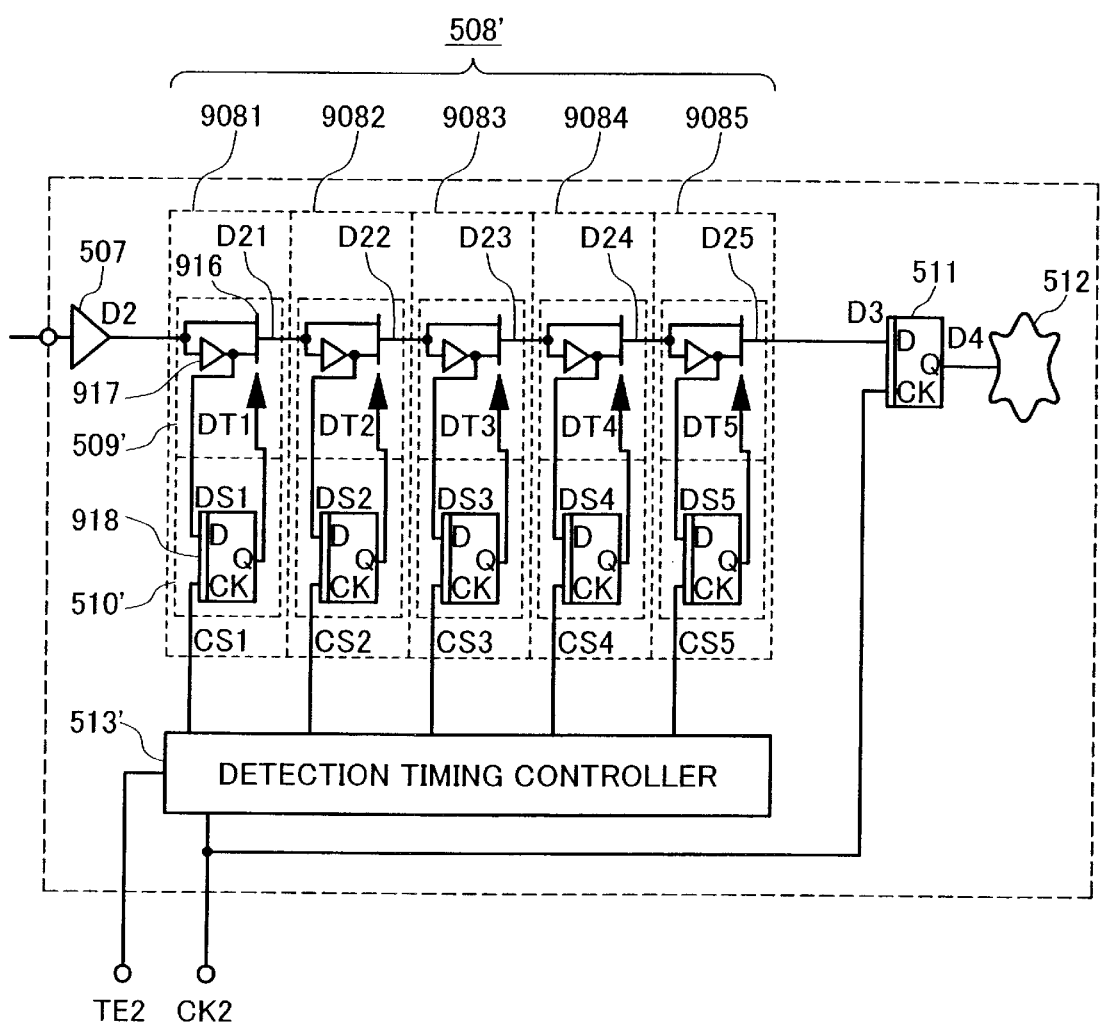
FIG. 9 is a block diagram showing still another exemplary structure of the receiver logic circuit.

FIG. 9 shows another exemplary structure of the receiver logic circuit shown in FIG. 5.

A signal phase controller 508' adopted in the structure shown in FIG. 9 is constituted by a cascaded connection of five phase control units 9081, 9082, 9083, 9084 and 9085, wherein each of these phase control units is comprised of a variable delay circuit 509' which is constituted by a selector 916 and a delay element 917 and a signal phase detection circuit 510' including a flip-flop circuit 918, similarly to the structure shown in FIG. 6. However, the signal phase controller 508' now under consideration differs from the signal phase controller 508 shown in FIG. 6 in the respect that the delay quantities (i.e., amount of delay) of the delay elements in the individual stages are given by 16Tf, 8Tf, 4Tf, 2Tf and Tf sequentially in this order as viewed from the input side. In other words, magnitude of change of the delay quantity in the variable delay circuit increases progressively by a common ratio toward the input side. The selector selects the input via the delay element or alternatively straightforwardly, the output of the selector being transferred to the succeeding stage. Further, the detection timing signals supplied to the individual phase control units from the detection timing controller 513' are not common to the individual units. Instead, the detection timing signals CS1, CS2, CS3, CS4 and CS5 which are deviated from one to another by a minute time are supplied so that the detecting operation and determination of the delay quantity can be completed orderly and sequentially from the input side.

The flip-flop circuits 918 constituting the signal phase detection circuits 510', respectively, detect the levels of the detecting signals DS1, DS2, DS3, DS4 and DS5 passed sequentially through the relevant delay elements at the timings indicated by the detection timing signals CS1, CS2, CS3, CS4 and CS5, respectively, to thereby hold the detected levels, respectively. The signals Q representing the levels being held are used as the delay control signals DT1, DT2, DT3, DT4 and DT5, respectively, for controlling the selecting operation of the selector 916.

As described hereinbefore, the period of the detection timing signal CS1, CS2, CS3, CS4, CS5 is so set as to be equal to or longer than that of the test signal sent from the sender logic circuit. Parenthetically, generation and interruption of the detection timing signal CS is controlled by the control signal TE2 supplied externally of the integrated circuit.

Figure 10:
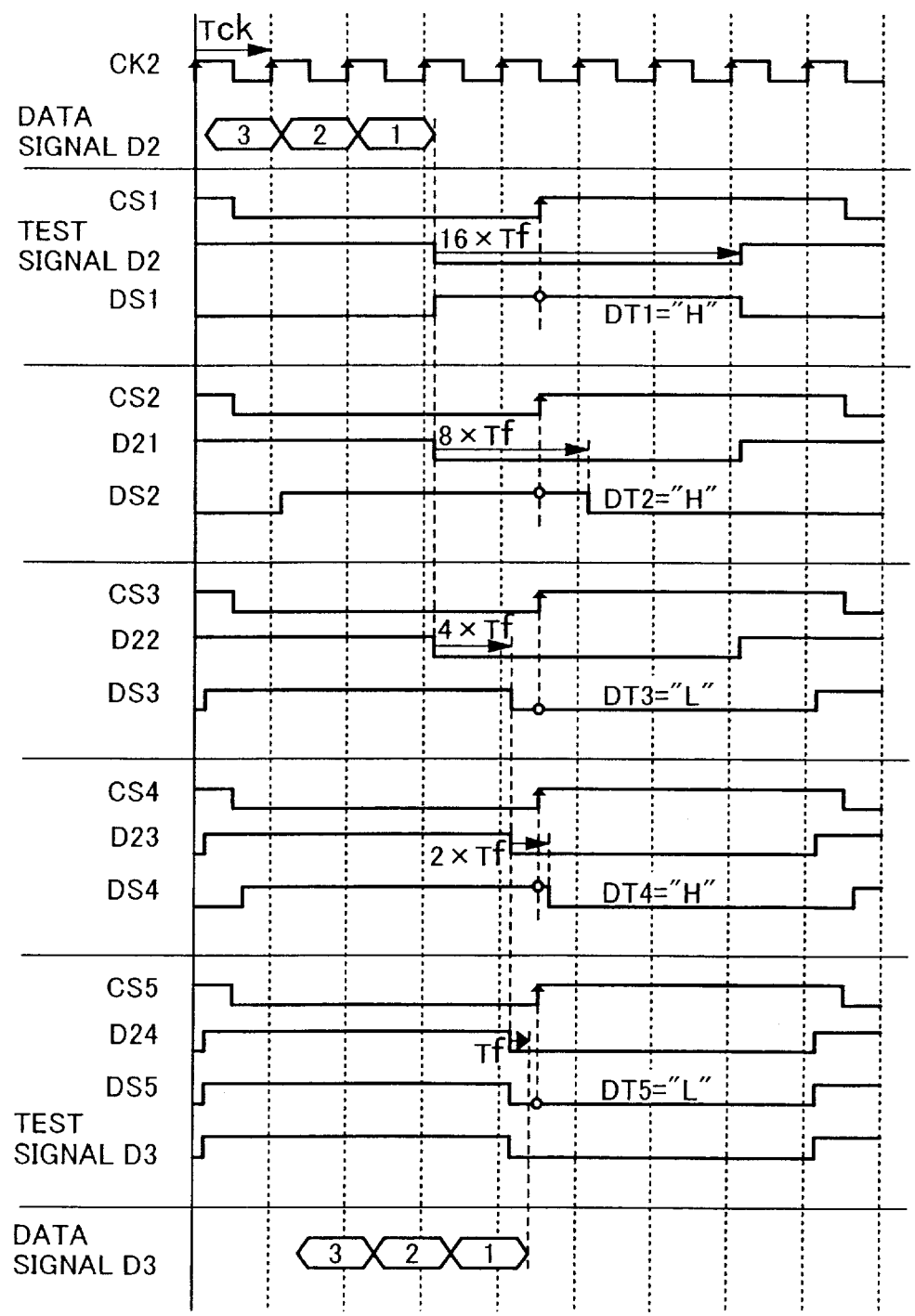
FIG. 10 is a timing chart for illustrating timing relations among various signals in the receiver logic circuit shown in FIG. 9.
Figure 11:
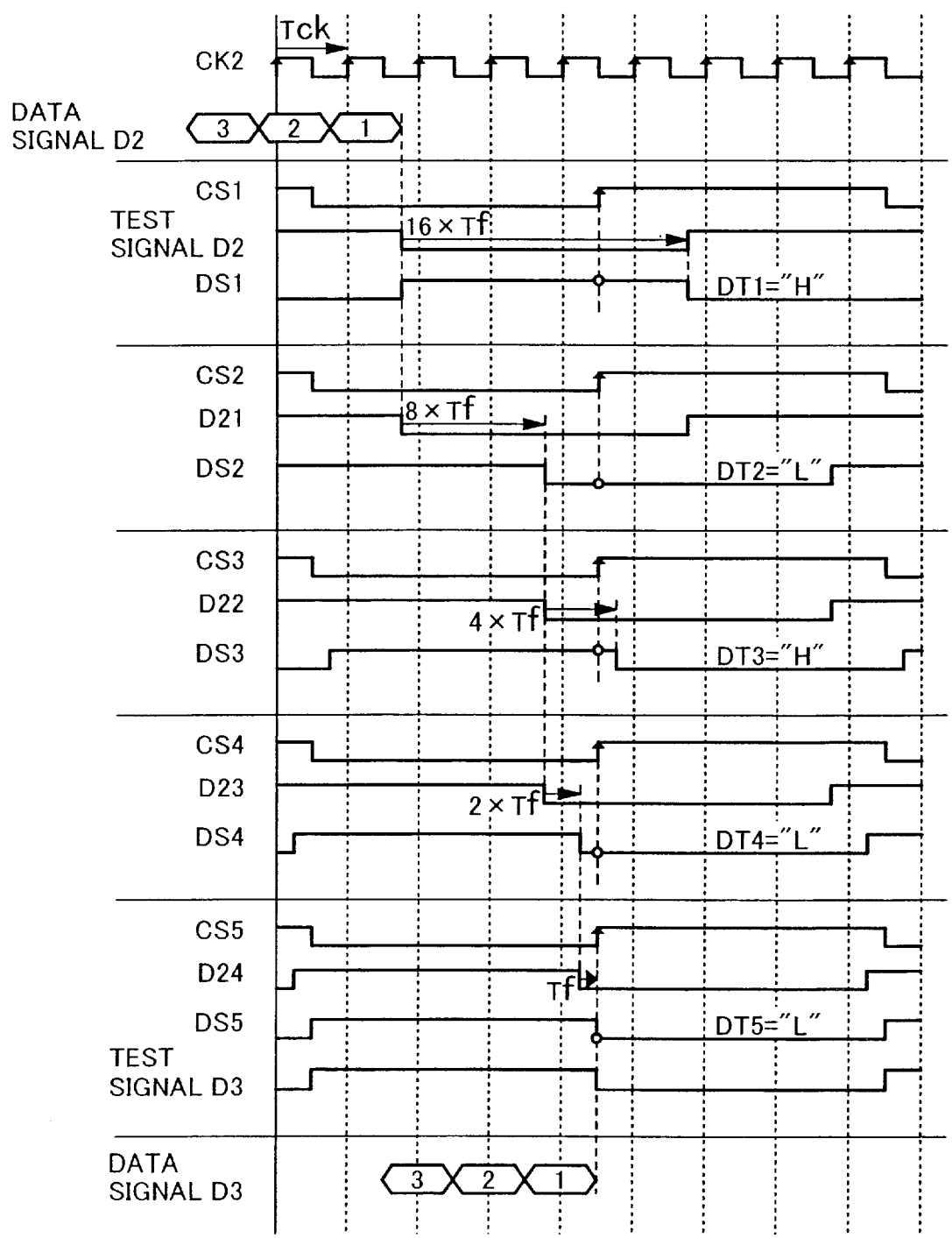
FIG. 11 is another timing chart for illustrating timing relations among various signals in the receiver logic circuit shown in FIG. 9.
Figure 12:
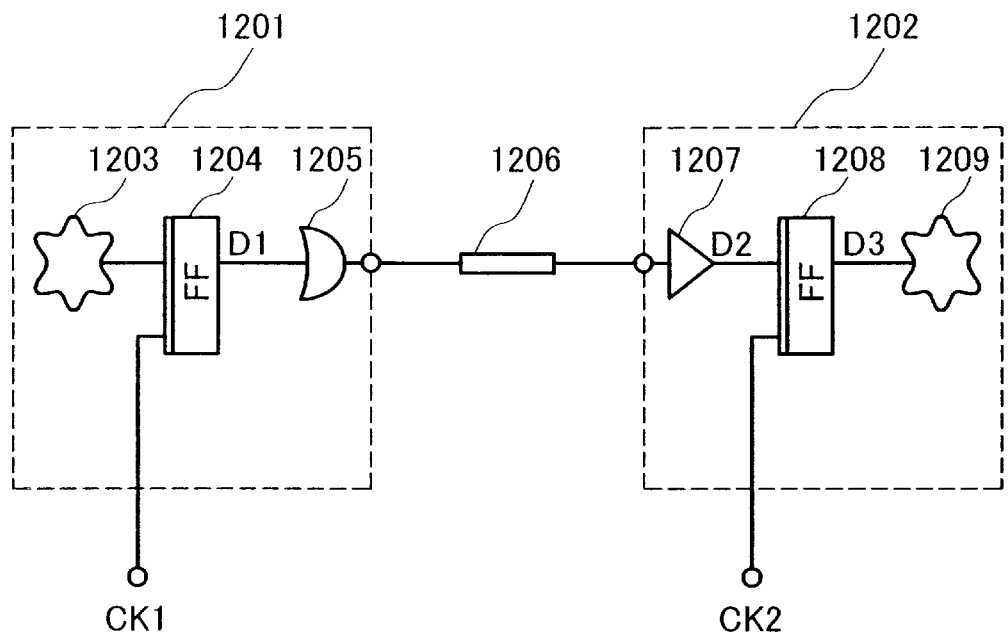
FIG. 12 is a block diagram for illustrating, by way of example, a conventional interface circuit.
Figure 13:
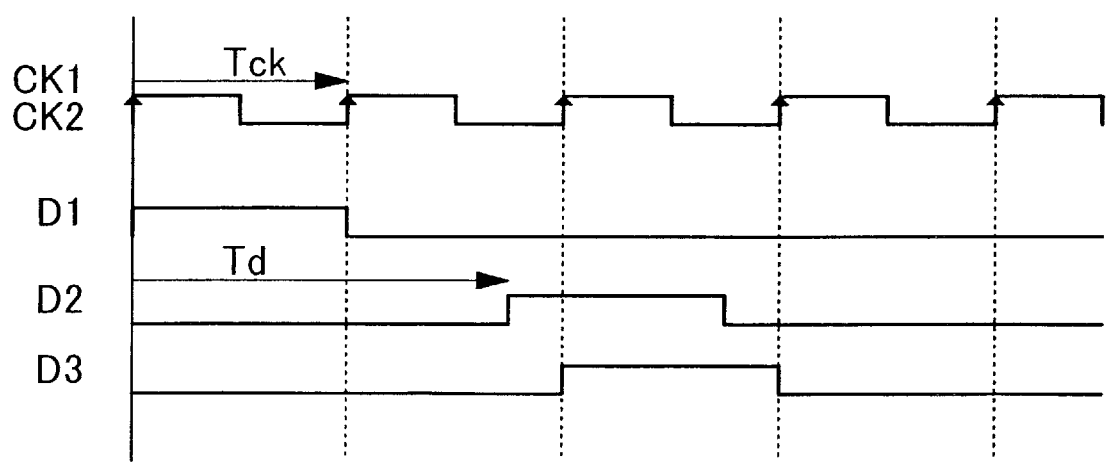
FIG. 13 is a timing chart for illustrating timing relations in the interface circuit shown in FIG. 12.
Figure 14:
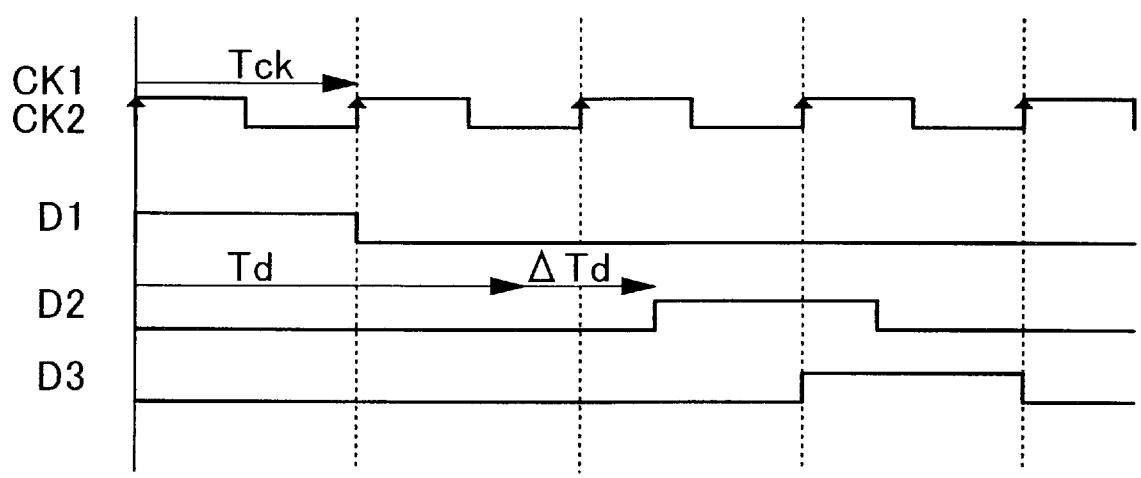
FIG. 14 is another timing chart for illustrating, by way of example, a conventional interface circuit.

Next, referring to FIGS. 10 and 11, description will turn to operations involved in adjustment of the delay time of the data signal in the interface circuit according to the instant embodiment of the invention shown in FIG. 9. FIGS. 10 and 11 show the operations involved in adjustment thereof. The operation illustrated in FIG. 11 differs from that shown in FIG. 10 in the respect that the test signal D2 arrives at an advanced timing when compared with a case shown in FIG. 10.

In both of these figures, reference character CK2 designates the clock signal of a period Tck.

The data signal D2 and the data signal D3 are illustrated at the timing for ordinary data signal transmission, while the other signals are shown at the respective timings in the phase control operation mode.

The test signal D2 is sent out from the sender logic circuit in the course of the phase control operation to be applied to the input terminal of the signal phase controller 9081. The test signal D2 has a phase which coincides with that of the data signal D2.

At this juncture, it should be mentioned that since the delay quantity or amount to be adjusted is at least twice as long as the period Tck of the clock signal, the period of the test signal D2 is set to be 8×Tck in a pattern of four periods of level "H" being followed by four periods of level "L".

On the other hand, the period of the detection timing signal CS1, CS2, CS3, CS4, CS5 supplied to the signal phase detection circuit 910 is set to a value equal to a multiple of the period of the test signal D2 by a natural number with a view to avoiding erroneous detection. In the case of the instant embodiment of the invention, the period of the detection timing signal CS is set to be equal to that of the test signal D2, by way of example.

At first, the test signal D2 inputted to the phase control unit 9081 is transformed to the detecting signal DS1 after having been delayed by a time 16×Tf in the delay element. Since the flip-flop circuit 918 latches and holds the value or level of the signal DS1 at the leading edge timing of the detection timing signal CS1 in the signal phase detection circuit, the values or levels at the time points each indicated by a circular mark in FIGS. 10 and 11 are held as the results of the detection. In the case of the examples illustrated in FIGS. 10 and 11, both the delay control signals DT1 assume the level "H". The phase adjusting operation of the phase control unit 9081 is then terminated, whereupon the detection timing signal CS1 assumes the level "H" with the level of the delay control signal DT1 being fixed. As a result of this, the test signal D2 is inhibited from passing through the delay element with the signal D21 being transmitted to the succeeding phase control unit 9082.

Subsequently, the test signal D21 inputted to the phase control unit 9082 is similarly transformed to the detecting signal DS2 which has undergone delay of 8×Tf through the delay element. Since the signal phase detection circuit holds the level of the signal DS2 at the leading edge timing of the detection timing signal CS2 in the signal phase detection circuit, the values at the time points each indicated at a circular mark in FIGS. 10 and 11 are held as the results of detection. In the case of the example illustrated in FIG. 10, the delay control signal DT2 assume the level "H" with the delay control signal DT2 assuming the level "L" in the case of the example illustrated in FIG. 11. The phase adjusting operation of the phase control unit 9082 is then terminated, whereupon the value of the detection timing signal CS2 assumes the level "H" in the case illustrated in FIG. 10 while it assumes the level "L" in the case shown in FIG. 11, wherein the value of the delay control signal DT2 is fixed. As a result of this, the test signal D21 is inhibited from passing through the delay element shown in FIG. 10 while the test signal D21 is allowed to pass through the delay element shown in FIG. 11, whereupon a signal D22 is transmitted to the succeeding phase control unit 9083.

In succession, the phase control units 9083, 9084 and 9085 are sequentially put into operation, as a result of which the delay control signal DT3 is set to the level "L", the delay control signal DT4 is set to the level "H" and the delay control signal DT5 is set to the level "L" in the case of the example illustrated in FIG. 10, while in the case illustrated in FIG. 11, the delay control signal DT3 is set to the level "H" with the delay control signal DT4 being set to the level "L" and the delay control signal DT5 to be level "L", respectively, whereby conduction or blocking of the individual delay elements are selected.

As a consequence, the delay time in total amounts to 5Tf in the case illustrated in FIG. 10. On the other hand, in the case of the example illustrated in FIG. 11, the delay time in total amounts to 10Tf. This is to say, the phase of the test signal D3 passed through the phase control unit of the final stage is so adjusted as to substantially coincide with the phase of the detection timing signal CS1, CS2, CS3, CS4, CS5 in both the cases illustrated in FIG. 10 and FIG. 11.

Since the individual flip-flop circuits 918 of the signal phase controller 508' hold the respective outputs in the phase adjusting or controlling operation mode, the phase of the data signal transferred to the flip-flop circuit 511 substantially coincides with the phase of the detection timing signal CS1, CS2, CS3, CS4, CS5, respectively, regardless of data inputting.

As is apparent from the foregoing, with the circuit configuration described above, it is possible to make the phase of the data signal D3 substantially coincide with the phase of the detection timing signal CS1, CS2, CS3, CS4, CS5 through the phase control operation. Thus, normal signal reception by the flip-flop circuit 511 can be realized by performing such control with the detection timing controller 513' such that the phase of the leading edge of the detection timing signal CS has a sufficient time margin relative to the phase of the leading edge of the clock signal CK.

As can now be appreciated, according to the teachings of the present invention, variation in the delay time involved in the signal transmission from the sender logic circuit to the receiver logic circuit due to variance in the manufacturing processes can be detected for thereby adjusting or regulating the delay quantity, whereby the normal signal transmission or transfer can be realized.

The foregoing description has been made on the presumption that one data signal is transmitted from the sender logic circuit to the receiver logic circuit. It goes however without saying that the present invention can easily be applied to the transmission of plural data signals as well. In that case, the circuitry employed for the adjustment may be shared among the plural data signals.

It should further be mentioned that a system clock signal generated by a common clock signal source may be employed for deriving therefrom the clock signal CK1 used by the sender logic circuit and the clock signal CK2 used by the receiver logic circuit.

Furthermore, such arrangement may equally be adopted that the system clock signal is employed as the clock signal CK1 while the clock signal transmitted by way of the same path as that for the data signal sent from the sender logic circuit is used as the clock signal CK2.

Owing to such arrangement that the detection timing signal having a sufficient time margin relative to the phase of the leading edges of the clock signal mentioned above is generated by the detection timing controller 513', a sufficient time margin can be ensured for the signal reception by the flip-flop circuit of the receiver logic circuit, whereby normal signal transmission can be realized satisfactorily.

Additionally, as described hereinbefore in conjunction with the embodiments of the invention, when the variation of the delay time of the data signal exceeds the period of the clock signal, the number of the signal phase controllers mentioned previously may be increased to thereby extend or enlarge the adjustable time duration so as to exceed the variation of the delay time while increasing the time duration in which the test signal remains at the level "H" longer than the variation of the delay time. In that case, the period of the test signal is twice as long as the variation of the delay time or more and becomes longer than the period of the normal data signal. Furthermore, in the case where the test signal of the period mentioned above is employed, the period of the detection timing signal serving for timing the detecting operation should be set longer than the period of the test signal in order to evade the erroneous detection.

As will now be understood, according to the present invention, it is required to set the period of the test signal to be twice as large as the variation of the delay time of the data signal or more in case the variation of the delay time exceeds the period of the clock signal. When the period of the signal is extended as mentioned above, influence of the foreign noise is generally mitigated during signal transmission. Accordingly, even when the system operates normally when it is adjusted by the test signal, there may arise the possibility that normal operation is not ensured for the transmission of the data signal because the period thereof is only a fraction of the period of the test signal. To cope with this problem, the present invention teaches that the adjustment is first carried out by using the test signal having the period twice as long as the variation of the delay time or more, which is then followed by execution of readjustment by using the test signal of shorter period.

The variation of the delay time which continues to exist after the first adjustment is decreased below the adjustable limit of the initial adjustment. The sum obtained by adding this remaining variation to the variation of the delay time brought about due to foreign noise represents the variation quantity to be adjusted through the readjust process. In that case, even if the period of the test signal is twice as long as the variation quantity for readjustment or more, the period of the test signal for the readjustment can be shortened as compared with that of the test signal for the initial adjustment to such extent that the adjustment can be carried out in the state close to the period of the actual data signal. By repeating this procedure, the period of the test signal can progressively be shortened.

By repeating the adjustment until the period of the data signal becomes same as that of the test signal, the delay time adjustment in which the variation of the delay time brought about by the foreign noise is taken into account can be realized.

As can be appreciated from the foregoing description, variation or change of the delay time involved in the signal or data transmission due to variance in the manufacturing processes can automatically be adjusted or compensated for so that phase difference which ensures correct signal/data reception can be realized. Thus, high-speed data signal transmission can be realized with high reliability.

Many modifications and variations of the present invention are possible in the light of the above techniques. It is therefore to be understood that within the scope of the appended claims, the invention may be practiced otherwise than as specifically described.

What is claimed is:

1. In a data transmission system for transferring a data signal among a plurality of logic circuits operating in synchronism in response to a given clock signal, an interface circuit provided in association with a receiver logic circuit for receiving the data signal, comprising:

a signal phase controller which includes a detecting circuit for detecting whether a signal to be received at a timing designated by a detection timing signal has arrived or not, and a variable delay circuit for changing a delay time of the signal received, wherein a delay quantity of said variable delay circuit is controlled in accordance with result of the detection of said detecting circuit to thereby regulate the delay time intervening between sending and reception to a time suited for the reception.

2. An interface circuit according to claim 1, wherein the signal to be received at said designated timing is made use of as a test signal sent from a sender logic circuit sending out said data signal.

3. An interface circuit according to claim 2, wherein a plurality of the signal phase controllers each comprised of said detecting circuit and said variable delay circuit are connected in cascade, said detection timing signal being supplied to the detecting circuit of each of said signal phase controllers for allowing each of said detecting circuits to detect whether the test signal to be received at the timing designated by said detection timing signal has carried or not, and wherein in each of said signal phase controllers, delay quantity of the associated variable delay circuit is controlled in dependence on the relevant result of the detection.

4. An interface circuit according to claim 3, wherein said detection timing signal is simultaneously applied to said plurality of signal phase controllers connected in cascade for thereby allowing the detecting circuits of said signal phase controllers to perform simultaneously detection as to arrival of said test signal.

5. An interface circuit according to claim 3, wherein said detection timing signal is sequentially applied to said plurality of signal phase controllers connected in cascade for thereby allowing the detecting circuits of said signal phase controllers to perform sequentially detection as to arrival of said test signal.

6. An interface circuit according to claim 3, wherein a given phase difference is constantly established between phase of said detection timing signal and that of the clock signal supplied to said receiver logic circuit.

7. An interface circuit according to claim 3, wherein a given phase difference is constantly established between phase of said detection timing signal and that of the clock signal sent to said receiver logic circuit from the sender logic circuit together with a data signal.

8. An interface circuit according to claim 3, wherein said detection timing signal has a period which exceeds a variable delay by which a delay time intervening between sending and reception of the test signal is to be changed for adjustably setting a desired timing suited for the reception.

9. An interface circuit according to claim 3, wherein said detection timing signal has a period equal to a product of the period of said test signal multiplied by a natural number.

10. An interface circuit according to claim 3, wherein said test signal has a period equal to a product of the period of a data signal transferred between said logic circuits multiplied by a natural number.

11. An interface circuit according to claim 3, wherein detection performed by said detecting circuit as to arrival of said test signal to be received at the timing designated by said detection timing signal is carried out repetitively while shortening sequentially and progressively the periods of said test signal and said detection timing signal.

* * * * *